United States Patent [19]

Kawazoe et al.

[11] Patent Number: 4,700,367
[45] Date of Patent: Oct. 13, 1987

[54] PULSE WIDTH CONTROL CIRCUIT

[75] Inventors: Akio Kawazoe; Hisashi Nakamura, both of Tokyo, Japan

[73] Assignee: Oki Electric Industry Co., Ltd., Tokyo, Japan

[21] Appl. No.: 809,415

[22] Filed: Dec. 16, 1985

[30] Foreign Application Priority Data

Dec. 17, 1984 [JP] Japan .................................. 59-264497

[51] Int. Cl.$^4$ ........................ H03K 5/15; G05B 19/18
[52] U.S. Cl. ........................................ 377/2; 377/39; 377/45; 377/114; 377/43; 328/62; 328/71; 328/105
[58] Field of Search .................. 377/2, 114, 39, 45; 307/234, 518; 328/63, 72, 60, 62, 71, 105

[56] References Cited

U.S. PATENT DOCUMENTS

| | | | |
|---|---|---|---|
| 3,663,938 | 5/1972 | Baer | 377/2 |
| 3,676,650 | 7/1972 | Henegar | 377/2 |
| 3,930,201 | 12/1975 | Ackermann et al. | 328/63 |
| 4,015,493 | 4/1977 | Woolston | 377/2 |

Primary Examiner—John S. Heyman
Attorney, Agent, or Firm—Wenderoth, Lind & Ponack

[57] ABSTRACT

A pulse width control circuit for providing a control signal to adjust variations of electrical characteristics among a plurality of printing elements has an up/down counter and a plurality of control signal generating circuits. The up/down counter counts the number of pulses of a clock signal and delivers the counted value. The control signal generating circuit compares the counted values from the up/down counter with set values corresponding to conduction time periods of the currents used for driving light emitting diodes, and generates a plurality of control pulse signals having pulse widths whose central positions thereof are in accord with each other.

7 Claims, 9 Drawing Figures

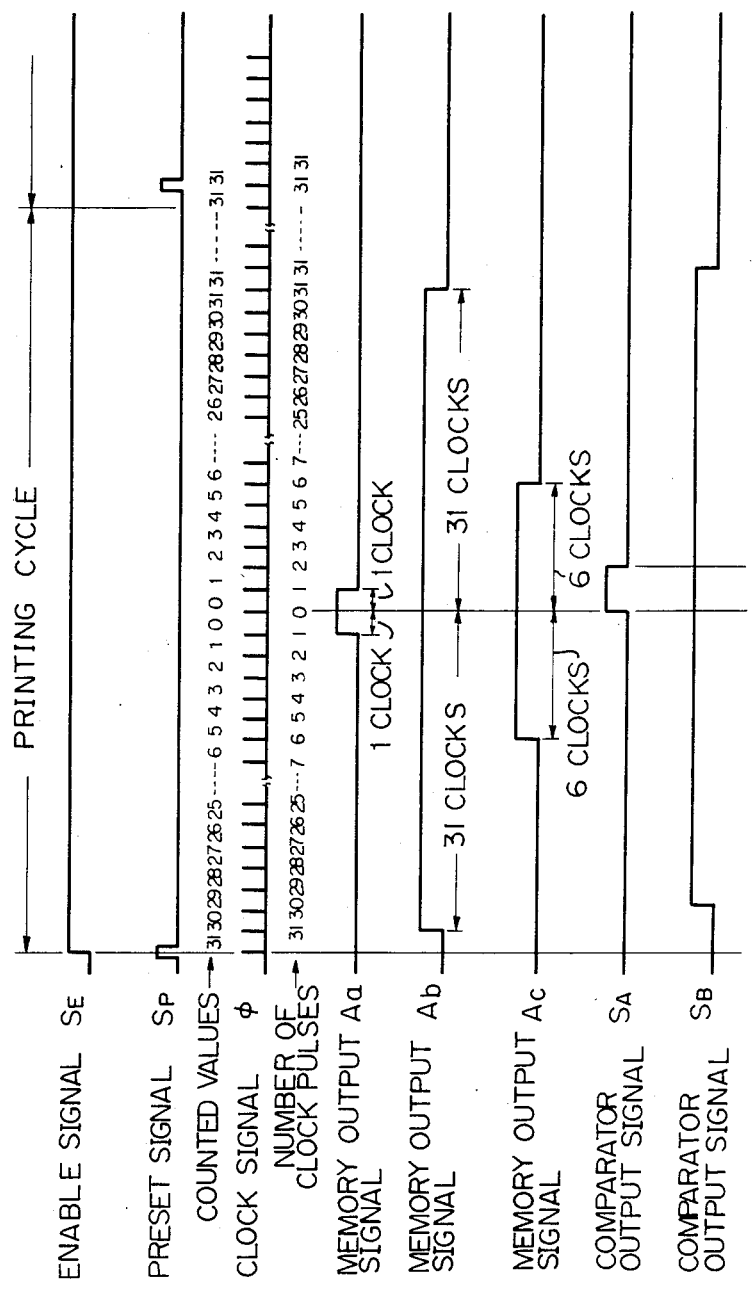

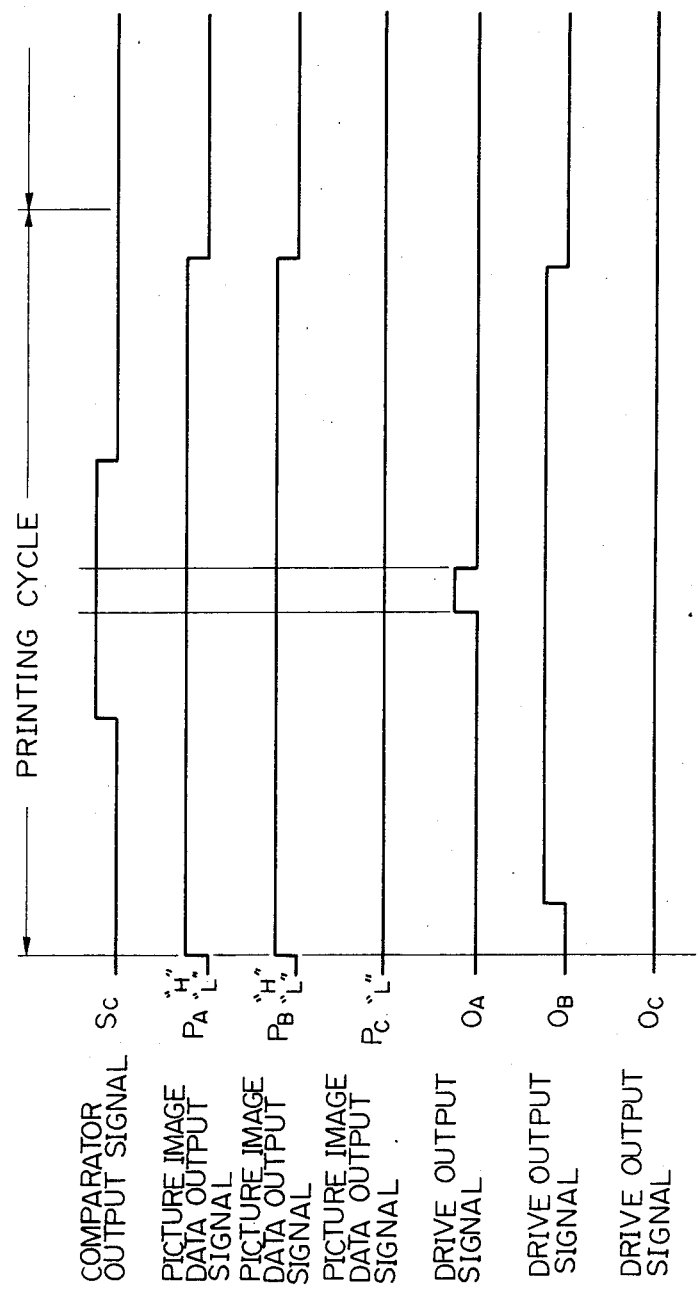

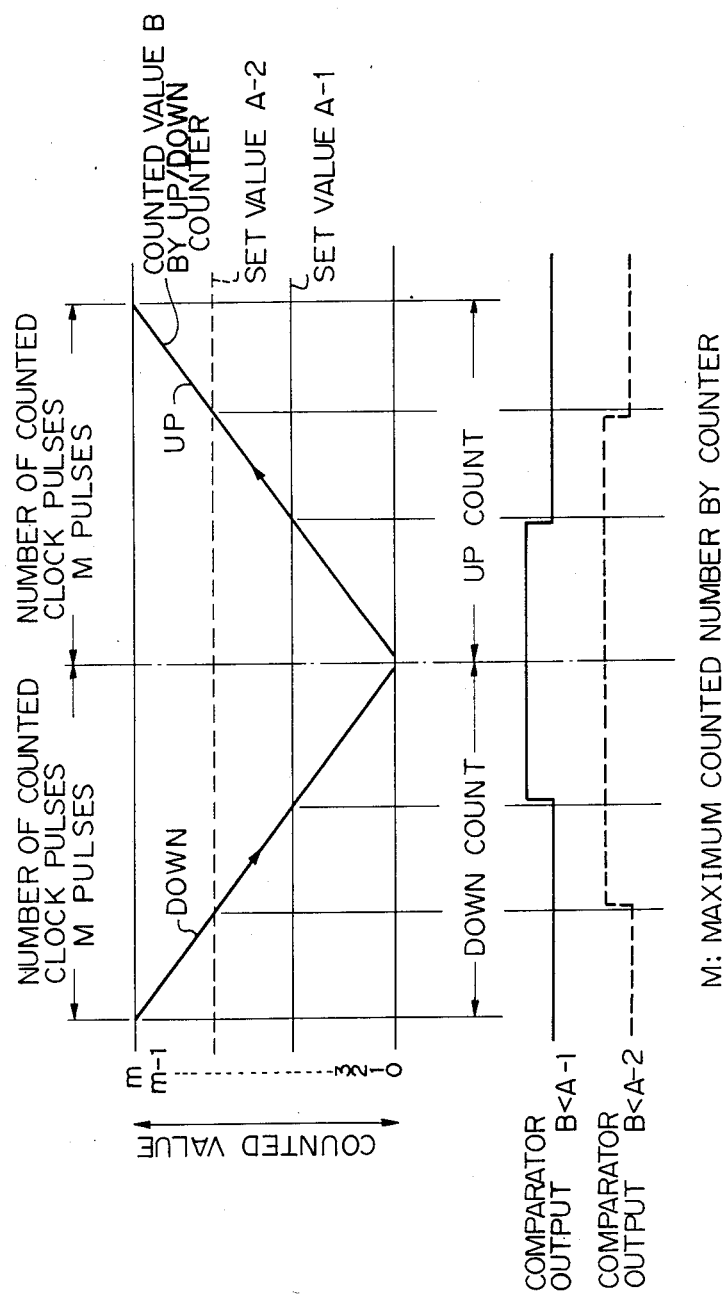

4,700,367

PULSE WIDTH CONTROL CIRCUIT

BACKGROUND OF THE INVENTION

1. Field of the invention

The present invention relates to a pulse width control circuit for controlling pulse widths of a drive signal used to drive a printing head of a printer.

2. Description of the Prior Art

An optical printer has little noise in printing and is used for various applications.

The optical printer can selectively control an optical dotted-pattern borne by light emitted from a printing head onto a photosensor provided on a drum surface and transfer the electrostatic information so formed on the photosensor onto a printing paper sheet to print characters comprising picture elements thereon. The printing head comprises, for example, a plurality of LED array IC devices comprising 128 light emitting elements. Each of the light emitting elements constituting the LED array is driven by a current available from a control circuit so as to emit light.

However, the luminance characteristics of the respective light emitting elements of the LED array are generally scattered (i.e.-variable) depending on the manufacturing processes thereof. If the light emitting elements are employed without adjusting their luminance characteristics, printed characters on a printing paper sheet are uneven and thus result in difficulty in their being put to practical use.

Conventionally, to uniformly illuminate the photosensor, a pulse width control circuit is employed for controlling the time intervals during which drive currents flow through the respective light emitting elements to assure the same luminance characteristics thereof.

Such a prior art control circuit is disclosed in, for example, Japanese Utility Model Application Nos. 54-113996 and 58-25024.

However, although a prior art control circuit can provide uniform luminance characteristics for the respective light emitting elements by adjusting, as described above, the conduction time intervals of the driving current pulses, all of the driving current pulses rise up at the same time. Accordingly, the prior art control circuit suffers from a problem in that the centers of printed dots (picture elements) on a printing sheet are displaced by a distance l with respect to each other depending on the durations of the current conduction, as shown by $P_a$ and $P_b$ in FIG. 4, for example. The displacement is more increased with the photosensor drum rotated at a higher speed, and deteriorates printing quality to the atmost.

SUMMARY OF THE INVENTION

It is an object of the present invention to provide a pulse width control circuit capable of making the centers of the conduction times of respective drivinG current pulses be in accord with each other.

Another object of the present invention is to provide a pulse width control circuit capable of effectuating high quality printing.

Still another object of the present invention is to provide a pulse width control circuit suited to an optical printer capable of printing a high quality image at a high speed.

According to the present invention, a pulse width control circuit for providing control signals to compensate for variations in electrical characteristics among a plurality of printing elements of a printing head comprises an up/down counter for counting the number of pulses of a clock signal to deliver a digital code indicative of the resulting counted value; a plurality of comparison circuits each of which compares set data corresponding to a current conduction period of a respective one of said printing elements with the counted value of the clock signal to deliver one of the control signals, each of the control signals being symmetrically varied from the center of the pulse width thereof with respect to a fixed common time; and a plurality of waveform shaping circuits each of this is respectively connected to an output of a respective one of said comparison circuits for removing spike signals contained in the output of said respective comparison circuit so as to output a shaped control signal.

In addition, a printer circuit including a pulse control circuit according to the present invention has a drive circuit for driving a printing head composed of a plurality of printing elements, a gate circuit connected to the drive circuit for issuing a control signal to selectively control the printing elements of the printing head, a memory for storing set value data corresponding to the conduction time intervals of driving signal pulses serving to drive the respective printing elements of the printing head, a picture element data output circuit combined with the gate circuit for selecting a prescribed printing element from among the printing elements of the printing head, and a pulse width control circuit for comparing the counted values of clock signal pulses with set values available from the memory corresponding to currents for delivering a plurality of control signals to the gate circuit so that the central positions thereof are in accord with each other.

The above and other objects, features, and advantages of the invention will be more apparent from the following detailed description taken in conjunction with the accompanying drawings.

BRIEF DESCRIPTION OF THE DRAWINGS

FIGS. 2A and 2B are timing charts illustrating the operation of the printer circuit of FIG. 1.

FIG. 3 is a characteristic diagram illustrating the operating of the up/down counter used for a comparator circuit of FIG. 1.

DESCRIPTION OF THE PREFERRED EMBODIMENT

An optical printer circuit including a pulse width control circuit according to the present invention will be described with reference to FIGS. 1A–1B, 2A–2B and 3.

Figure 1A:
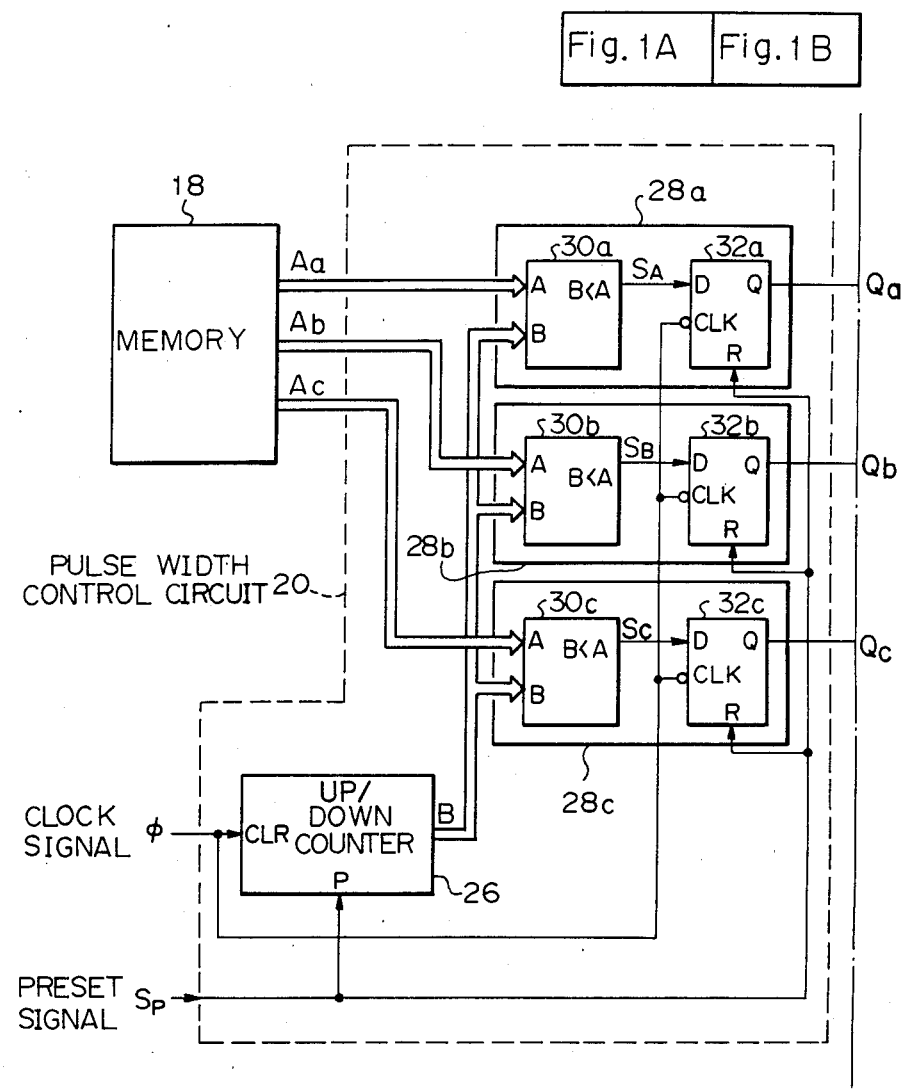
FIG. 1; consisting of FIG. 1A and FIG. 1B, illustrates a circuit diagram of an optical printer circuit including a pulse width control circuit according to the present invention.
Figure 1B:
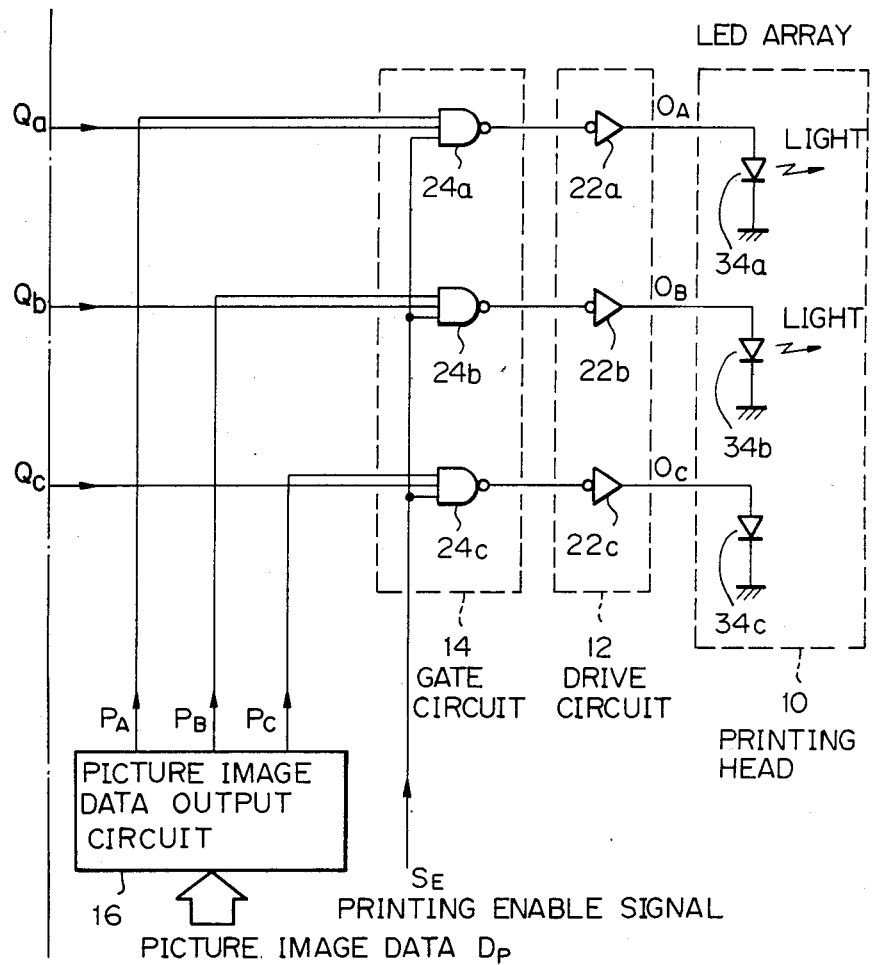
Figure 4:
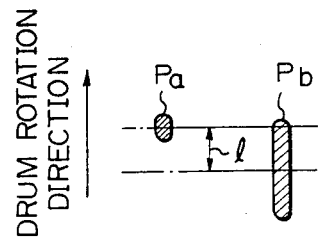
FIG. 4 is a view illustrating picture element dots printed by a prior art printer circuit.

As shown in FIGS. 1A–1B, the optical printer comprises, for example, a printing head 10 composed of a plurality of light emitting diodes 34a–34c, a drive circuit 12 connected to the light emitting diodes 34a–14c for supplying a drive current thereto, a gate circuit 14 connected to the driving circuit 12 for responding to an enable signal $S_E$ to selectively deliver a control signal to the drive circuit 12, a picture image data output circuit 16 connected to the gate circuit 14 for receiving picture image data designating on/off operation of the light emitting diodes 34a–34c to be lighted and delivering selection bit signals $P_A$, $P_B$, $P_C$ to respective NAND gates 24a, 24b, and 24c of the gate circuit 14, and a memory 18 for storing set value data $A_a$, $A_b$, $A_c$, each comprising a plurality of bits, corresponding to an n set (n=3 in case of FIGS. 1A–1B) of adjusted conduction time intervals serving to normalize the luminance of each light emitting diode of the printing head 10.

The optical printer further has a pulse width control circuit 20 for delivering control signals $S_a$, $S_b$, and $S_c$ to the gate circuit 14 to control the luminance of the respective light emitting diodes, and the center of the pulse width of the control signal is symmetrical to a common fixed time, as shown in FIGS. 2A and 2B.

The drive circuit 12 is composed of, for example, current driving circuits 22a, 22b, and 22c, each composed of NPN bipolar transistors.

The gate circuit 14 is, for example, composed of NAND gates 24a, 24b, and 24c.

The pulse width control circuit 20 includes an up/down counter 26 for counting the number of pulses of a clock signal when a preset signal $S_p$ of an "H" level is supplied for example, and control signal generating circuits 28a, 28b, and 28c for respectively comparing set value data $A_a$, $A_b$, and $A_c$ available from the memory 18 for brightness control corresponding to the conduction periods of currents flowing through the light emitting diodes with counted value data B available from the up/down counter 26 and for delivering control signals $Q_a$, $Q_b$, and $Q_c$ having prescribed pulse widths.

The control signal generating circuits 28a, 28b, and 28c respectively include comparator circuits 30a, 30b, and 30c for delivering "H" level control signals $S_A$, $S_B$, and $S_C$ when the set data $A_a$, $A_b$, $A_c$ from the memory 18 is more than output data B from the up/down counter 26 and waveform shaping circuits 32a, 32b, and 32c for removing a spike signal which may erroneously be supplied from the comparator circuits 30a, 30b, and 30c.

The waveform shaping circuits 32a, 32b, and 32c may each be a D type flip-flop triggered by, for example, a trailing edge of a clock signal $\phi$ pulse.

The up/down counter 26 and the control signal generating circuits 28a, 28b, and 28c exhibit, for example, a characteristic as shown in FIG. 3.

Figure 6:
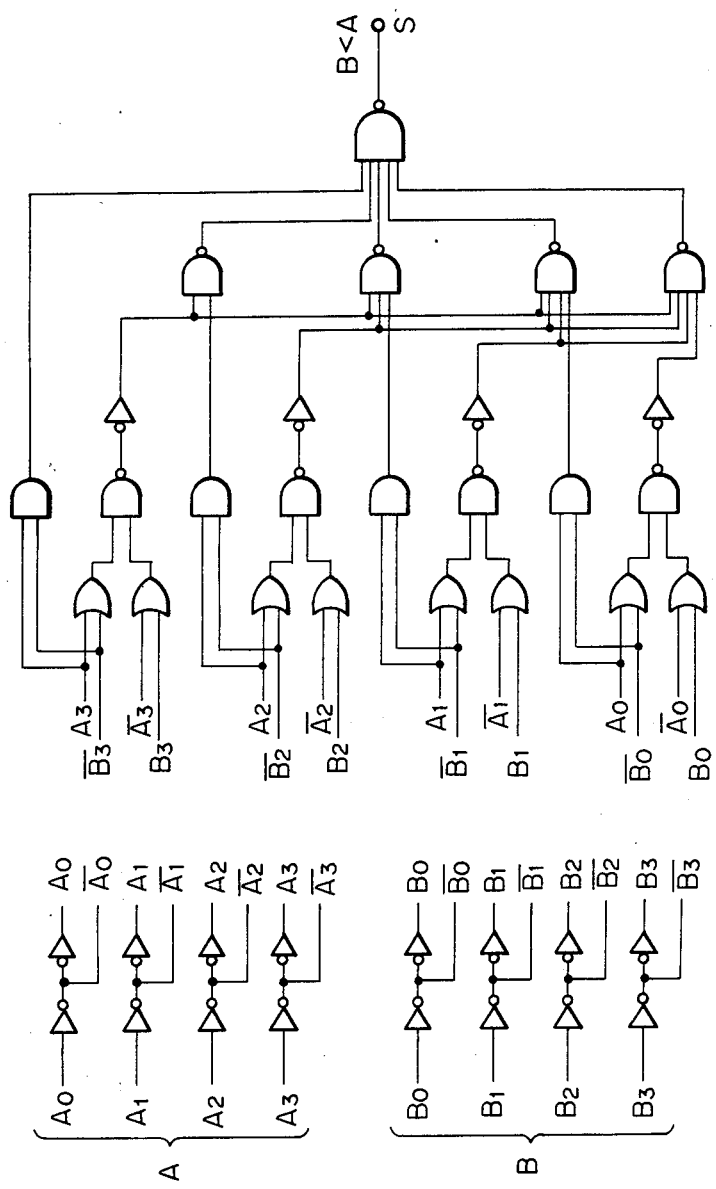
FIG. 6 is an example of the comparator circuit shown in FIG. 1.

Each of the comparator circuits 30a, 30b, and 30c has, for example, NAND, AND, OR, and inverter circuits as shown in FIG. 6.

As shown in FIG. 3, the up/down counter 26 is, when an "H" level preset signal $S_P$ is supplied thereto, initialized to a binary signal corresponding to a counted value m of an output B thereof, and then counts down the binary signal to a counted value of O, and then counts up to the counted value m, and then stops the count operation thereof, and holds the above state until the next preset signal $S_P$ is supplied.

Each of the comparator circuits 30a, 30b, and 30c compares a set value (binary signal) $A_a$, $A_b$, and $A_c$ corresponding to the adjusted current conduction (light emission) period with a counted value (binary signal) B equivalent to the number of pulses contained in a clock signal, and provides an "H" level signal for the period satisfying the relationships $B < A_a$, $B < A_b$, and $B < A_c$. In the instance, each of the comparator circuits 30a, 30b, and 30c provides a control signal having a pulse width which is symmetrical with respect to the counted value 0, as shown in FIG. 3.

The operation of an optical printer circuit including a pulse width control circuit according to the present invention will now be described with reference to the timing chart shown in FIGS. 2A–2B.

The memory 18 is assumed to deliver set value data $A_a$, $A_b$, and $A_c$ (e.g., 1, 31, 6) corresponding to the current conduction periods to the comparator circuits 30a, 30b, 30c in order to normalize the luminances of light emitted from the light emitting diodes 34a, 34b, and 34c.

In addition, the gate ciruit 14 is assumed to have been supplied with picture image data "110" in one printing cycle of the picture image data output circuit 16.

Furthermore, the counting regions of the up/down counter 26 is assumed, for example, to be from 31 to 0 and from 0 to 31.

First, the optical princger circuit is set to a printing mode when the enable signal $S_E$ becomes an "H" level, whereby the NAND gates 24a, 24b begins to be ready to transmit a signal in conformity with picture image data $D_P$.

When a preset signal $S_P$ of an "H" level is input to a preset terminal P of the up/down counter 26, the counter is set to a printing mode to start counting the number of pulses contained in an approximately 200 kHz clock signal, while also causing the data flip-flops (i.e.-waveform shaping circuits) 32a, 32b, 32c to be reset.

In the counting-down operation of the up/down counter 26, when a counted value reaches 30, the value becomes less than data $A_a$ having been supplied to the comparator 30a and thereby allows an output $S_A$ of the comparator circuit 30a to become an "H" level (refer to FIG. 2(A)).

Then, when the counted value of the counter 26 resches 5, the value becomes less than the data $A_c$, and thereby allows the output $S_c$ of the comparator 30c to become an "H" level (refer to FIG. 2(B)).

Subsequently, the counted value of the counter 26 is counted down to 0, and the values becomes less than the data $A_b$, and the comparator circuit 30b provides an "H" level signal $S_B$ (refer to FIG. 2(A)).

The counter 26 counts down clock pulses of the clock signal until reaching a count of 0, and then counts up clock pulses.

In the counting-up operation, when the counter 26 delivers data having a value which is more than the counted value of 1, the counted data becomes greater than the data $A_a$, and so the output of the comparator 30a changes to an "L" level.

In succession, when the counted value of the counter 26 exceeds 5, the output of the comparator 30c becomes an "L" level.

Furthermore, when the counted value of the counter 26 exceeds 30, the output of the comparison circuit 30b becomes an "L" level.

With the operation described above, the comparison circuits 30a, 30b, 30c deliver control signals respectively having pulse widths corresponding to 2, 62 and 12 clock periods (refer to FIGS. 2A and 2B.

The D type flip-flops of waveform shaping circuits 32a, 32b and 32c deliver control signals $Q_a$, $Q_b$, and $Q_c$ each delayed in order by 1 clock as compared with the output signal available from their respective comparison circuits 30a, 30b, and 30c.

In this printing mode, since an "L" level picture image bit signal has been supplied to the NAND circuit 24c, the gate circuit 14 transfers only output signals from the comparator circuits 32a and 32b to the driving circuit 12.

Accordingly, the output circuits 22a and 22b energize the light emitting diodes 34a and 34b for a prescribed period, for example, by an approximately 10 mA current (refer to FIG. 2B).

The light emitting diodes 34a and 34b thereby emit light with a uniform luminance.

Figure 5:
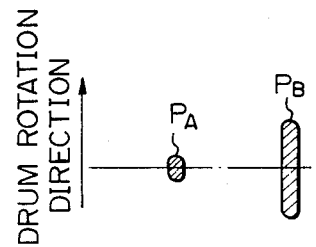
FIG. 5 is a view illustrating picture element dots printed by the printer circuit including the pulse control circuit of the present invention.

In addition, since the pulse width of the control signal is variable symmetrically with respect to the counted value of zero, as shown in FIG. 2A, no displacement is generated between centers of display dots printed on a printing paper sheet, as shown by the dots $P_A$ and $P_B$ in FIG. 5.

Consequently, according to the pulse width control circuit of the present invention, printing quality of the optical printer can be advantageously improved.

The pulse width control circuit according to the present invention may be applied to a thermal printer circuit capable of providing gradation for a thermosensitive paper sheet.

Figure 7:
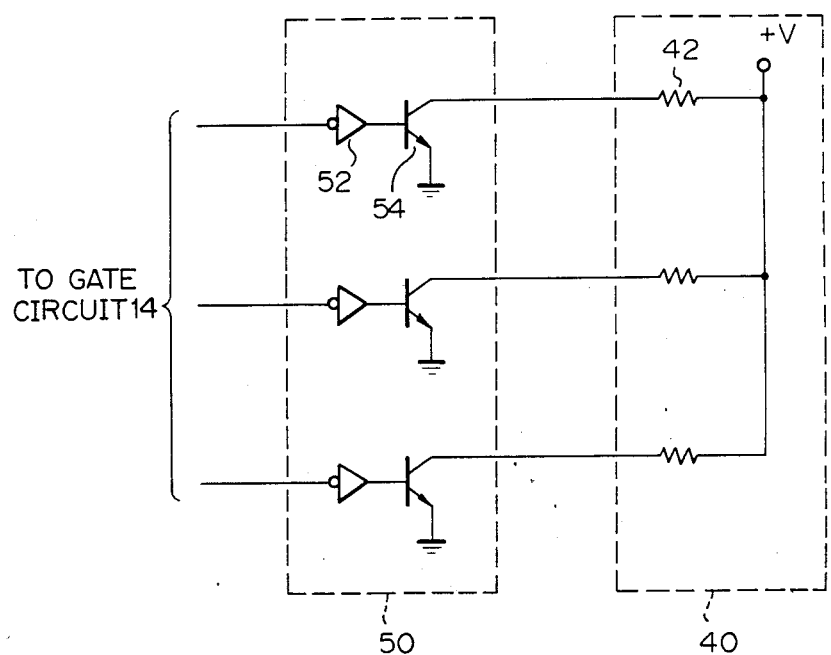
FIG. 7 shows a thermal head and a drive circuit thereof used for the thermal printer circuit.

FIG. 7 shows a thermal printing head 40 and a driving circuit 50 for use in a thermal printer.

These circuits are controlled by the pulse width control circuit 20, picture image data output circuit 16, and gate circuit 14 shown in FIGS. 1A and 1B.

Each element of the thermal printing head 40 comprises, for example, a resistance heating element 42, while each element of the driving circuit 50 comprises an inverter 52 and an NPN bipolar transistor 54.

In the present embodiment, set value data corresponding to the heating time of each resistance heating element is stored in the memory 18.

According to the pulse width control circuit of the present invention, with the repetition frequency of the clock signal made higher and with a bit number of the counted value data of the counter as well as the set value data stored in the memory both being increased, a trail of a printed picture image dot due to a longer current conduction time through the printing element can be shortened to improve the resolving power of a printing head.

The pulse width control circuit according to the present invention can be very easily constructed as a semiconductor integrated circuit.

As described above, since the pulse width control circuit according to the present invention can allow the centers of the respective pulse widths of a plurality of control signals to be consistent with each other, a printer circuit with a high printing quality can be realized.

The present pulse width control circuit may be applicable to a control circuit for a printing head for use in an optical printer, a thermal printer, and a liquid crystal printer.

What is claimed is:

1. A pulse width control circuit suitable for providing control signals to compensate for variations in electrical characteristics among a plurality of printing elements of a printing head, comprising: a data providing means (a) an up/down counter for counting the number of pulses of a clock signal and for providing a digital code indicative of the resulting counted value;

(b) a plurality of comparison circuits respectively connected to said counter and said data providing means and each of which compares set data corresponding to a current conduction period of a respective one of said printing elements with said digital code of said counter to deliver one of said control signals, each of said control signals being symmetrically varied from the center of the pulse width thereof with respect to a fixed common time by said counter code; and (c) a plurality of waveform shaping circuits each of which is respectively connected to an output of a respective one of said comparison circuits for removing spike signals contained in the output of said respective comparison circuit so as to output a shaped control signal.

2. A pulse width control circuit according to claim 1, wherein said printing element is a light emitting diode.

3. A pulse width control circuit according to claim 1, wherein said printing element is a resistance heating element.

4. A printer circuit comprising:

(a) a printing head composed of a plurality of printing elements;

(b) a memory for storing a plurality of set data each of which corresponds to a current conduction period of a respective one of said printing elements, said periods being selected so as to compensate for variations in electrical characteristics among said plurality of printing elements of said printing head;

(c) a pulse width control and comparing circuit connected to said memory for receiving a plurality of said set data from said memory and for comparing said plurality of said set data with a counted value of a clock signal to control the delivery of a plurality of control signals each of which is symmetrically varied from the center of the pulse width of said control signal with respect to a common time by said counted value;

(d) a driving circuit connected with said printing head for driving said printing elements;

(e) a gate circuit connected between said driving circuit and said pulse width control circuit for delivering said control signals from said pulse width control circuit to said driving circuit in response to an enabling signal; and (f) a picture image data output circuit connected to said gate circuit for selecting said printing elements to be driven.

5. A printer circuit according to claim 4, wherein said pulse width control circuit comprises an up/down counter for counting the number of pulses of said clock signal to deliver a digital code indicative of the resulting counted value;

a plurality of comparison circuits each of which compares a respective one of said set data from said memory with said counted value from said up/down counter to deliver a respective one of said control signals; and a plurality of waveform shaping circuit each of which is connected to an output of a respective one of said plurality of comparison circuits for removing spike signals contained in the output of said respective comparison circuit so as to output a shaped control signal.

6. A further circuit according to claim 5, wherein said printing elements of said printing head comprise light emitting diodes.

7. A printer circuit according to claim 5, wherein said printing elements of said printing head comprise resistance heating elements.

* * * * *